(12) United States Patent
Kang et al.

(10) Patent No.: US 7,272,048 B2
(45) Date of Patent: Sep. 18, 2007

(54) NONVOLATILE MEMORY DEVICE CONTROLLING COMMON SOURCE LINE FOR IMPROVING READ CHARACTERISTIC

(75) Inventors: Sang-Chul Kang, Gyeonggi-do (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 11/194,945

(22) Filed: Aug. 1, 2005

(65) Prior Publication Data

US 2006/0072358 A1   Apr. 6, 2006

(30) Foreign Application Priority Data

Oct. 5, 2004   (KR) ................. 10-2004-0079039

(51) Int. Cl.
*G11C 11/34* (2006.01)
*G11C 16/06* (2006.01)
*G11C 16/04* (2006.01)

(52) U.S. Cl. ............... 365/185.2; 365/185.18; 365/185.21; 365/185.29

(58) Field of Classification Search ........... 365/185.2, 365/185.11, 185.23, 230.06, 185.18, 185.21, 365/185.29, 185.05
See application file for complete search history.

(56) References Cited

U.S. PATENT DOCUMENTS 5,696,717 A    12/1997   Koh
5,808,935 A *   9/1998   Kwon et al. ........... 365/185.17
5,936,890 A     8/1999   Yeom
5,963,475 A *  10/1999   Choi et al. ............ 365/185.11
6,671,204 B2   12/2003   Im
2001/0005015 A1*  6/2001 Futatsuyama et al. ......... 257/1

FOREIGN PATENT DOCUMENTS

| JP | 2001-143489 | 5/2001 |
| JP | 2003-257193 | 9/2003 |
| KR | 2003-0087674 | 11/2003 |

OTHER PUBLICATIONS

English language abstract of the Korean Publication No. 2003-0087674.
English language abstract of the Korean Publication No. 2001-143489.
English language abstract of the Korean Publication No. 2003-257193.

* cited by examiner

*Primary Examiner*—Anh Phung
*Assistant Examiner*—Allison P. Bernstein
(74) *Attorney, Agent, or Firm*—Marger Johnson & McCollom, P.C.

(57) ABSTRACT

A non-volatile memory device capable of improving a read characteristic includes memory blocks, each memory block having a plurality of word lines. A common source line is arranged to be shared by the memory blocks. A first transistor is connected to the common source line, and a voltage higher than a power supply voltage is applied to a gate of the first transistor during a read operation. A second transistor connects the first transistor to a reference voltage during the read operation.

17 Claims, 6 Drawing Sheets

NONVOLATILE MEMORY DEVICE CONTROLLING COMMON SOURCE LINE FOR IMPROVING READ CHARACTERISTIC

CROSS-REFERENCE TO RELATED APPLICATIONS

This U.S. Non-provisional patent application claims priority under 35 U.S.C. § 119 of Korean Patent Application 2004-79039 filed on Oct. 5, 2004, the entire contents of which are hereby incorporated by reference.

BACKGROUND OF THE INVENTION

The present invention relates to a non-volatile memory device, more particular to a common source line control scheme of a non-volatile memory device capable of improving a read characteristic.

There is increasing demand for semiconductor memories that can be electrically erased and programmed without refreshing data stored in the memories themselves. Also, there is a trend toward enhancing the storage capacity and the density of integration in memory devices. A NAND-type flash memory is one example of non-volatile semiconductor memories that provide high capacity and integration density needless of refreshing data stored therein. The flash memory devices retain their stored data even when their power supplies are interrupted. Thus, non-volatile memory devices are widely used in electronic devices such as portable terminals, portable computers, and the like, which are usually situated in an environment in which the possibility of power supply interruption is present.

Non-volatile memory devices such as NAND-type flash memory devices include electrically erasable and programmable read-only memory cells as their own memory cells. In general, a memory cell includes a cell transistor. The cell transistor includes a semiconductor substrate (bulk) of first conductivity (e.g., P-type), spaced source and drain regions of second conductivity (e.g., N-type) in the substrate, a channel region at a face of the substrate, between the spaced source and drain regions, a floating gate for storing charge carriers when the device is programmed, and a control gate which overlies the floating gate.

FIG. 1 shows a memory cell array 10 with memory cells having the construction mentioned above. Referring to FIG. 1, the memory cell array 10 includes a plurality of cell strings 11 (or called NAND cell strings). Each of the cell strings 11 is composed of a string selection transistor SST as a first selection transistor, a ground selection transistor GST as a second selection transistor, and a plurality of memory cells MC0~MCm serially connected between the string selection transistor SST and the ground selection transistor GST. The string selection transistor SST includes a drain connected to a corresponding bit line (BL0 to BLn) and a control gate connected to a string selection line SSL. The ground selection transistor GST includes a source connected to the common source line CSL and a gate connected to a ground selection line GSL. Furthermore, between a source of the string selection transistor SST and a drain of the ground selection transistor GST, the memory cells MCm~MC0 are serially connected with each other. The memory cells MCm~MC0 are respectively connected with corresponding word lines WLm~WL0.

As shown in FIG. 1, bit lines BL0~BLn are connected to page buffers PB0~PBn, respectively. As will be known by those skilled in the art, each page buffer functions as a sense amplifier during a read operation and a write driver during a write operation. Examples of the page buffers are disclosed U.S. Pat. No. 5,936,890, entitled "SEMICONDUCTOR FLASH MEMORY HAVING PAGE BUFFER FOR VERIFYING PROGRAMMED MEMORY CELLS", and U.S. Pat. No. 6,671,204, entitled "NON-VOLATILE MEMORY DEVICE WITH PAGE BUFFER HAVING DUAL REGISTERS AND METHODS OF USING THE SAME", incorporated by reference herein.

The common source line CSL is connected with the common source line driving circuit 20. The common source line driving circuit 20 of FIG. 1 corresponds to a part of an erase voltage adjusting means 10 shown in FIG. 3 of U.S. Pat. No. 5,696,717. The common source line driving circuit 20 includes a depletion MOS transistor 21 and an NMOS transistor 22. Channels of the depletion MOS transistor 21 and the NMOS transistor 22 are serially connected with each other between the common source line CSL and a reference voltage having a ground voltage. A power supply voltage VDD is applied to a gate of the depletion MOS transistor 21, and a control signal READ is applied to a gate of the NMOS transistor 22. The control signal READ is activated at a high level during the read operation, whereas it is inactivated at a low level during residual operations. The read operation includes program/erase verification read operations as well as a read operation. When a high voltage is transferred to the common source line CSL, the depletion MOS transistor 21 prevents the NMOS transistor 22 from being broken.

Although a memory cell array 10 having only one memory block is shown in FIG. 1, it will be apparent to those skilled in the art that the memory cell array has more memory blocks. Accordingly, the common source line CSL is arranged at the memory cell array 10 to be shared by the memory blocks.

As will be understood by those skilled in the art, the read operation is divided into a precharge interval, a develop interval, and a sense interval. During the precharge interval, bit lines BL0~BLn are charged with a predetermined precharge voltage by corresponding page buffers PB0~PBn. During the develop interval, electric potentials of bit lines become lower or are maintained according to states of selected memory cells. For example, when a selected memory cell is an on-cell or an erased memory cell, a sense current supplied from a page buffer flows in the common source line CSL through a cell string having a selected memory cell. This causes the electric potential of the bit line to be lowered. In contrast to this, when the selected memory cell is an off-cell or a programmed memory cell, the sense current supplied from the page buffer is interrupted by the selected memory cell, namely, the programmed memory cell. This causes the electric potential of the bit line to be maintained. During the sense interval, a corresponding page buffer senses the electric potential of each bit line. During the read operation, as shown in FIG. 2, the control signal READ is activated at a high level. This level causes a current flowing in the common source line CSL through cell strings to be discharged by the common source line driving circuit 20.

During the read operation, as shown in FIG. 2, the control signal READ is activated at a high level, thereby discharging a current of the common source line CSL through the NMOS transistor 22. As known by those skilled in the art, a current driving performance of a depletion MOS transistor 21 is lower than that of an NMOS transistor 22 under the same condition. For this reason, in the case of the common source line driving circuit 20 shown in FIG. 1, a current discharge of the common source line CSL is not restricted by the NMOS transistor 22, but is restricted by the depletion MOS transistor 21, the gate of which is coupled to a power supply voltage VDD. During the develop interval, when increased current flows in the common source line CSL, as shown in FIG. 2, the common source line CSL is not maintained at a ground voltage. This results from an RC loading of the common source line CSL that is coupled to an entire part of the memory cell array.

When a current flowing in the common source line CSL is not sufficiently discharged during a develop interval of the read operation, it is difficult to discriminate a state of the selected memory cell. This means that it takes a long time to sense program/erase states of the selected memory cell. Furthermore, in the worst case, the on-cell can be sensed as an off-cell, causing the deterioration of a read characteristic.

SUMMARY OF THE INVENTION

The present invention is a non-volatile memory device capable of improving a read characteristic.

An object of the present invention is to provide a non-volatile memory device with a common source line driving circuit, which improves current drivability during a read operation.

An aspect of the present invention is a non-volatile memory device including memory blocks, each memory block having a plurality of word lines, the non-volatile memory device comprising: a common source line arranged to be shared by the memory blocks; a first transistor connected to the common source line; and a second transistor for connecting the first transistor to a reference voltage during the read operation. A voltage higher than a power supply voltage is applied to a gate of the first transistor during a read operation.

Preferably, the higher voltage is a read voltage that is supplied to deselected word lines of the memory block during the read operation. More preferably, the first transistor is a depletion MOS transistor, and the second transistor is an NMOS transistor. Most preferably, the gate of the first transistor receives the power supply voltage during a program operation, and receives a ground voltage as the reference voltage during an erase operation.

A further aspect of the present invention is a non-volatile memory device, comprising: memory blocks; a common source line arranged to be shared by the memory blocks; and a common source line driving circuit for driving the common source line. The common source line driving circuit includes: a control signal generator for generating a control signal having a voltage changed according to an operation mode; a depletion MOS transistor connected to the common source line and controlled by the control signal from the control signal generator; and an NMOS transistor for connecting the depletion MOS transistor to a reference voltage during the read operation. The control signal has a voltage higher than a power supply voltage during a read operation.

Preferably, the higher voltage is a read voltage that is supplied to deselected word lines of the memory block during the read operation. More preferably, each of the memory blocks includes NAND cell strings. Preferably, the control signal has a power supply voltage during a program operation, and has a ground voltage as the reference voltage during an erase operation.

Another aspect of the present invention is a non-volatile memory device comprising memory blocks, a common source line arranged to be shared by the memory blocks, and a common source line driving circuit for driving the common source line. The common source line driving circuit includes: a control signal generator for generating a control signal having a voltage variable according to an operation mode of the non-volatile memory device; a first transistor for connecting an internal node to a power supply voltage during a program operation; a second transistor for connecting the internal node to a ground voltage during a read operation; a first depletion MOS transistor connected between the internal node and the common source line and controlled by the control signal; a resistor having a first end connected the common source line; a second depletion MOS transistor having a drain connected to a second end of the resistor and a gate connected to the power supply voltage; and a third transistor for connecting a source of the second depletion MOS transistor to the ground voltage during an erase operation. The control signal has a voltage higher than the power supply voltage during the read operation, and has a ground voltage during the erase operation.

Preferably, the first transistor is a PMOS transistor, whereas the second and third transistors are NMOS transistors. Preferably, the control signal generator includes: a PMOS transistor for providing the power supply voltage to a line of the control signal during the program operation; an NMOS transistor for connecting the control signal line to the ground voltage during the erase operation; and a switch pump for providing the higher voltage to the control signal line during the read operation. Preferably, the higher voltage is a read voltage that is supplied to deselected word lines of the memory block during the read operation.

Yet another aspect of the present invention is a non-volatile memory device comprising: memory blocks; a common source line arranged to be shared by the memory blocks; a read voltage generating circuit for generating a read voltage to be applied to the memory blocks during a read operation; and a common source line driving circuit for receiving the read voltage from the read voltage generating circuit and driving the common source line. The common source line driving circuit includes: a control signal generator for generating a control signal having a voltage variable according an operation mode and having the read voltage higher than a power supply voltage during the read operation; a depletion MOS transistor connected to the common source line and controlled by the control signal from the control signal generator; and an NMOS transistor for connecting the depletion MOS transistor to a reference voltage during the read operation.

Preferably, each of the memory blocks includes NAND cell strings. Preferably, the control signal has a power supply voltage level during a program operation, and has a ground voltage level during an erase operation as the reference voltage. Preferably, the control signal generator includes: a PMOS transistor for providing the power supply voltage to a line of the control signal during a program operation; an NMOS transistor for connecting the control signal line to the ground voltage during an erase operation; and a switch pump for providing the higher voltage to the control signal line during the read operation.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 3:
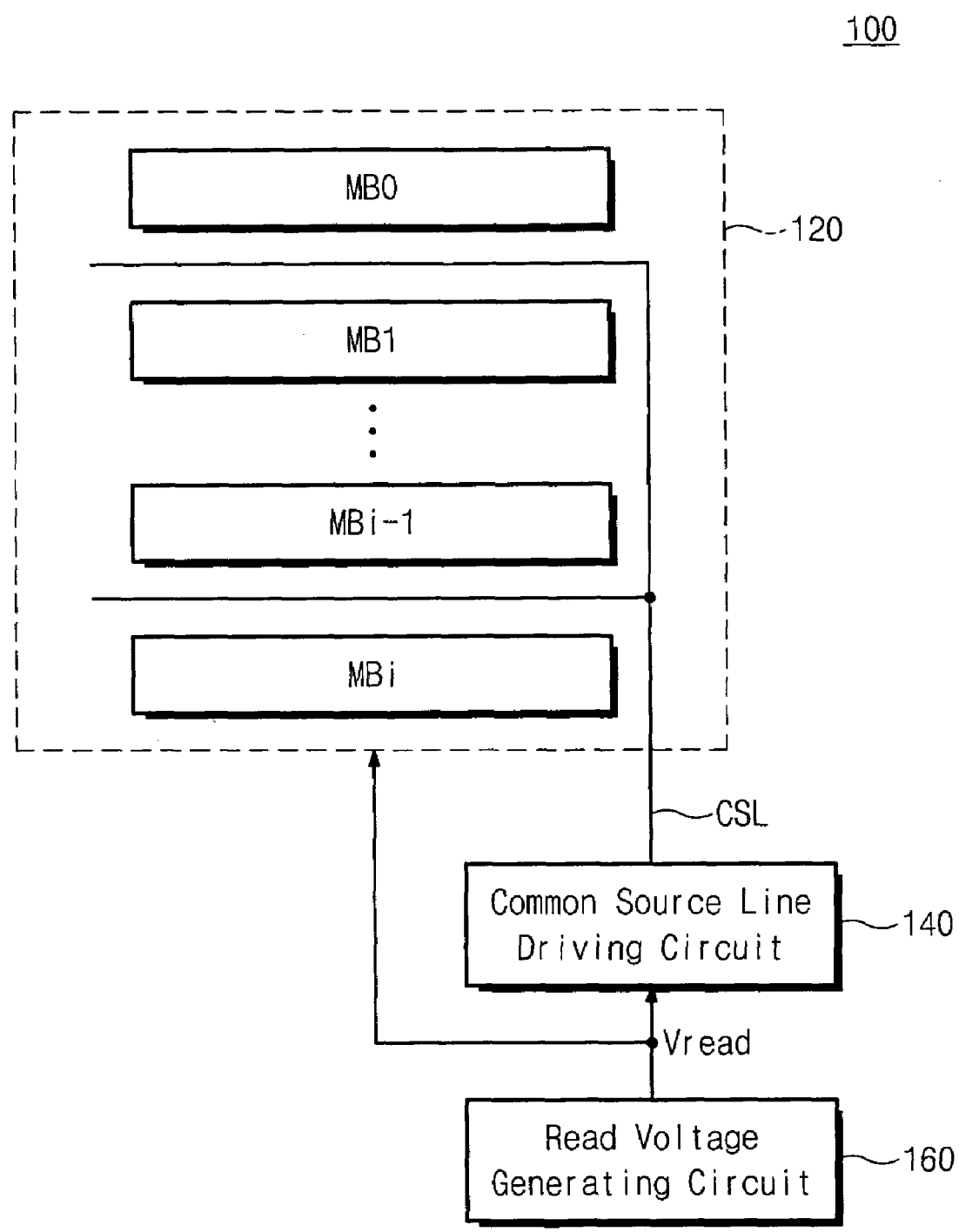
FIG. 3 is a block diagram schematically showing a non-volatile memory device according to an embodiment of the present invention.

FIG. 3 is a block diagram schematically showing a non-volatile memory device according to an embodiment of the present invention. The non-volatile memory device is a NAND-type flash memory device. It will be apparent to those skilled in the art that the present invention is applicable to other memory devices such as NROM, PROM, FRAM, and NOR-type flash memory device.

Figure 1:
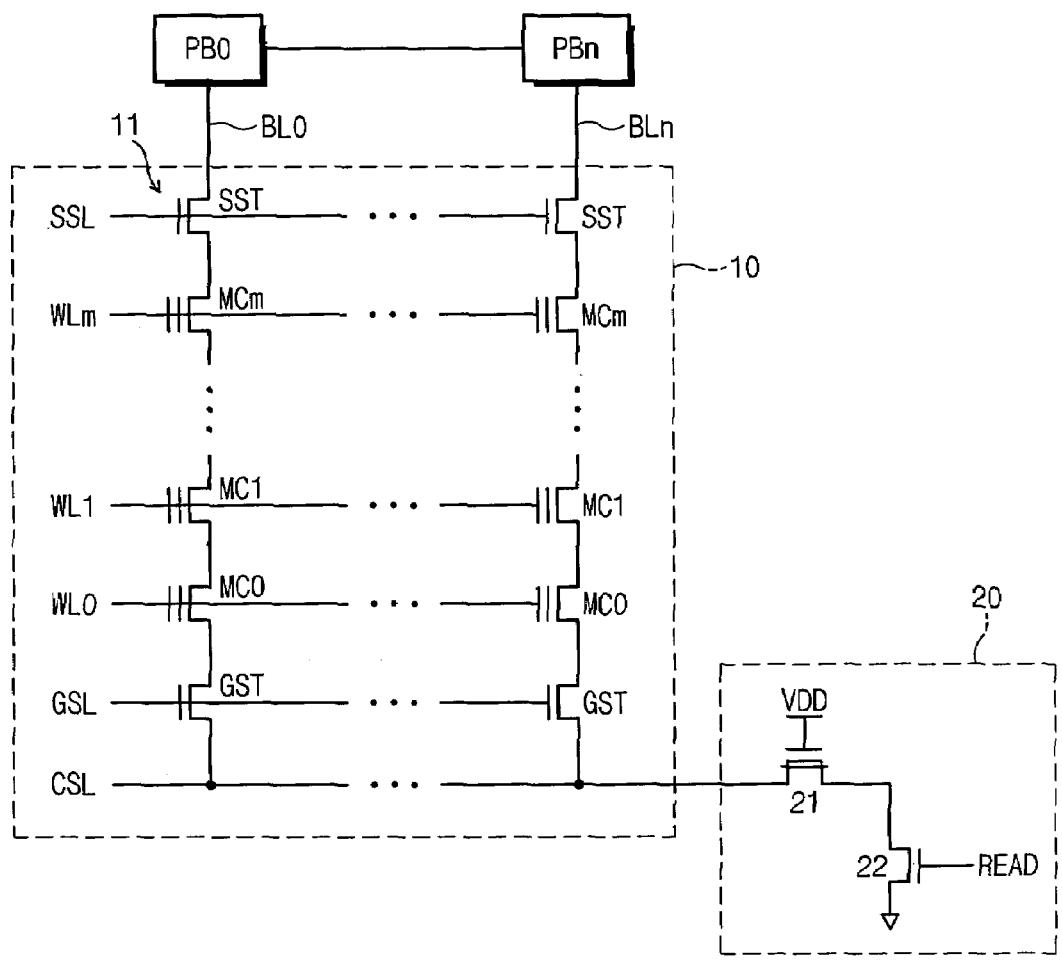
FIG. 1 is a block diagram showing a conventional non-volatile memory device.
Figure 2:
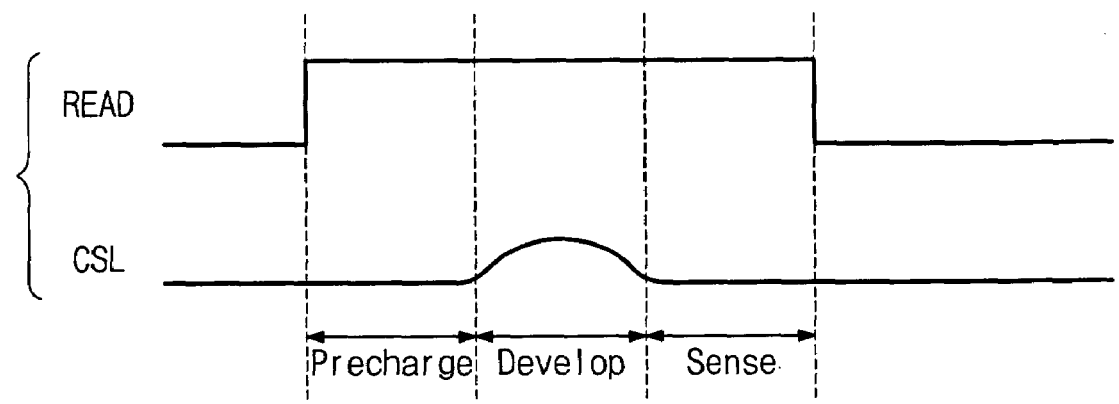
FIG. 2 is a timing diagram of signals for effectuating a read operation of the non-volatile memory device shown in FIG. 1.

Referring to FIG. 3, a non-volatile memory device 100 includes a memory cell array 120. The memory cell array 120 has a plurality of memory blocks MB0~MBi. Each of the memory blocks has the same structure as that of FIG. 1. Accordingly, the description thereof is abbreviated. A common source line CSL is arranged to be shared by the memory blocks MB0~MBi in the memory cell array 120. The common source line CSL is connected to a common source line driving circuit 140. A read voltage generating circuit 160 generates a voltage Vread (hereinafter referred to as read voltage) to be supplied to deselected word lines of a memory block. The common source line driving circuit 140 discharges a current to be transferred to the common source line CSL responsive to the read voltage from the read voltage generating circuit 160 during the read operation. As known by those skilled in the art, the read voltage Vread is set higher than a power supply voltage VDD, so that a programmed memory cell is sufficiently turned on.

Figure 4:
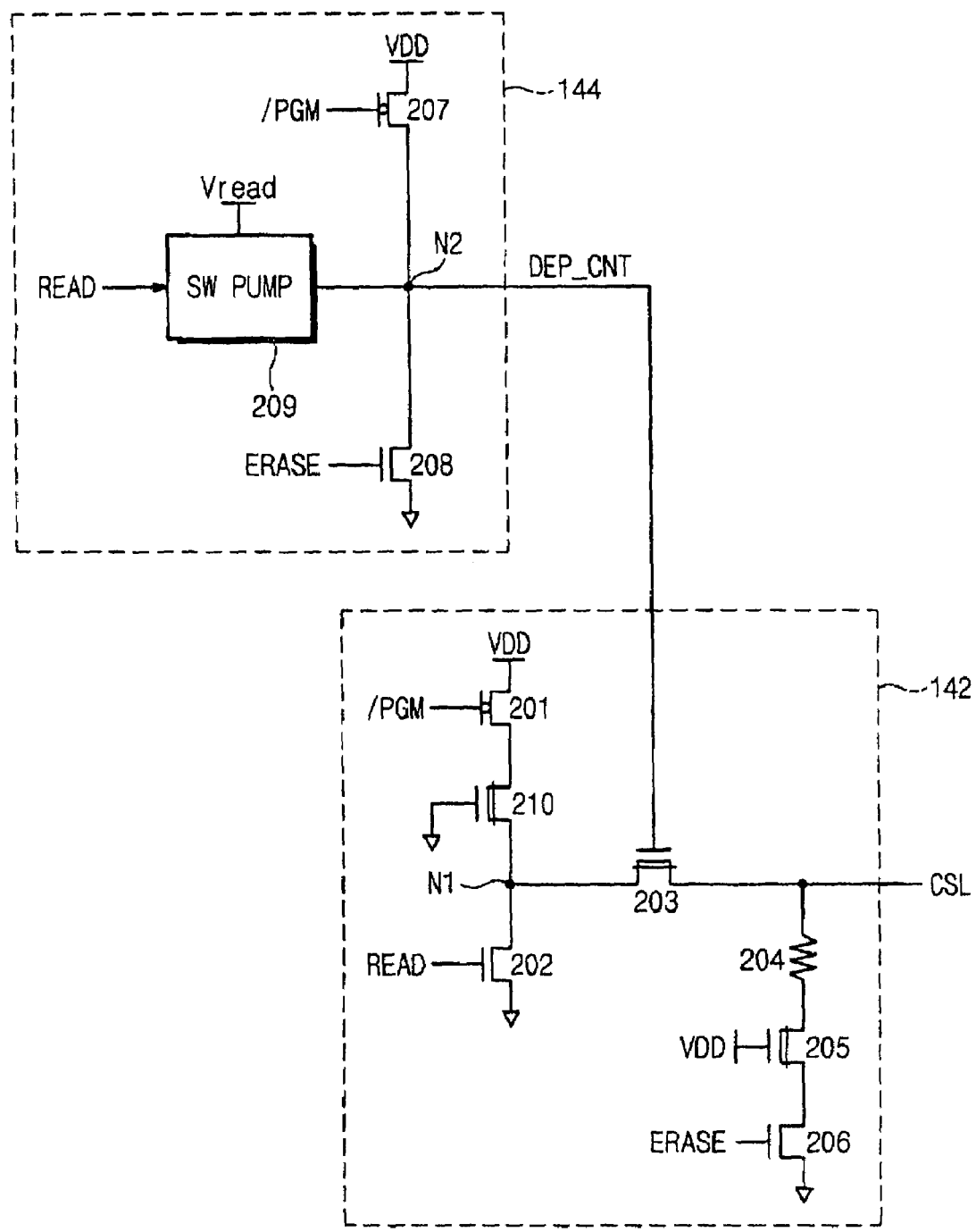
FIG. 4 is a circuit diagram showing the common source line driving circuit shown in FIG. 3.

FIG. 4 is a circuit diagram of an embodiment of the common source line driving circuit 140 in FIG. 3. With reference to FIG. 4, the common source line driving circuit 140 includes a driver 142 and a control signal generator 144. The driver 142 includes a PMOS transistor 201, NMOS transistors 202 and 206, depletion PMOS transistors 203, 205, and 210, and a resistor 204. The PMOS transistor 201 includes a source connected to a power supply voltage VDD, a drain connected to a first node N1 through the depletion MOS transistor 210, and a gate connected to receive a second control signal /PGM. A gate of the depletion MOS transistor 210 is connected with a ground voltage. The NMOS transistor 202 includes a drain connected to the first node N1, a source connected with the ground voltage, and a gate connected to receive a first control signal READ. The depletion MOS transistor 203 is connected between the first node N1 and the common source line CSL and is controlled by a fourth control signal DEP_CNT from node N2 of the control signal generator 144. The resistor 204 and transistors 205 and 206 are serially coupled between the common source line CSL and the ground voltage. A gate of the depletion MOS transistor 205 is connected to receive the power supply voltage VDD. A gate of the NMOS transistor 206 is connected to receive a third control signal ERASE. The NMOS transistor 206 is a high voltage transistor known in the art that is not influenced by a higher voltage.

As shown in FIG. 4, the control signal generator 144 includes a PMOS transistor 207, an NMOS transistor 208, and a switch pump 209. The PMOS transistor 207 includes a source connected with a power supply voltage VDD, a drain which is connected to a second node N2 for outputting the fourth control signal DEP_CNT, and a gate connected to receive the second control signal /PGM. The NMOS transistor 208 includes a drain connected to the second node N2, a source which is connected to the ground voltage, and a gate connected to receive the third control signal ERASE. The switch pump 209 provides the read voltage Vread to the second node N2. According to such a circuit arrangement, a voltage level of the fourth control signal DEP_CNT is set to be changed according to an operation mode of the non-volatile memory device. An example of the switch pump 209 is disclosed in U.S. Pat. No. 6,044,017, entitled "FLASH MEMORY DEVICE", which is incorporated by reference herein.

Figure 5:
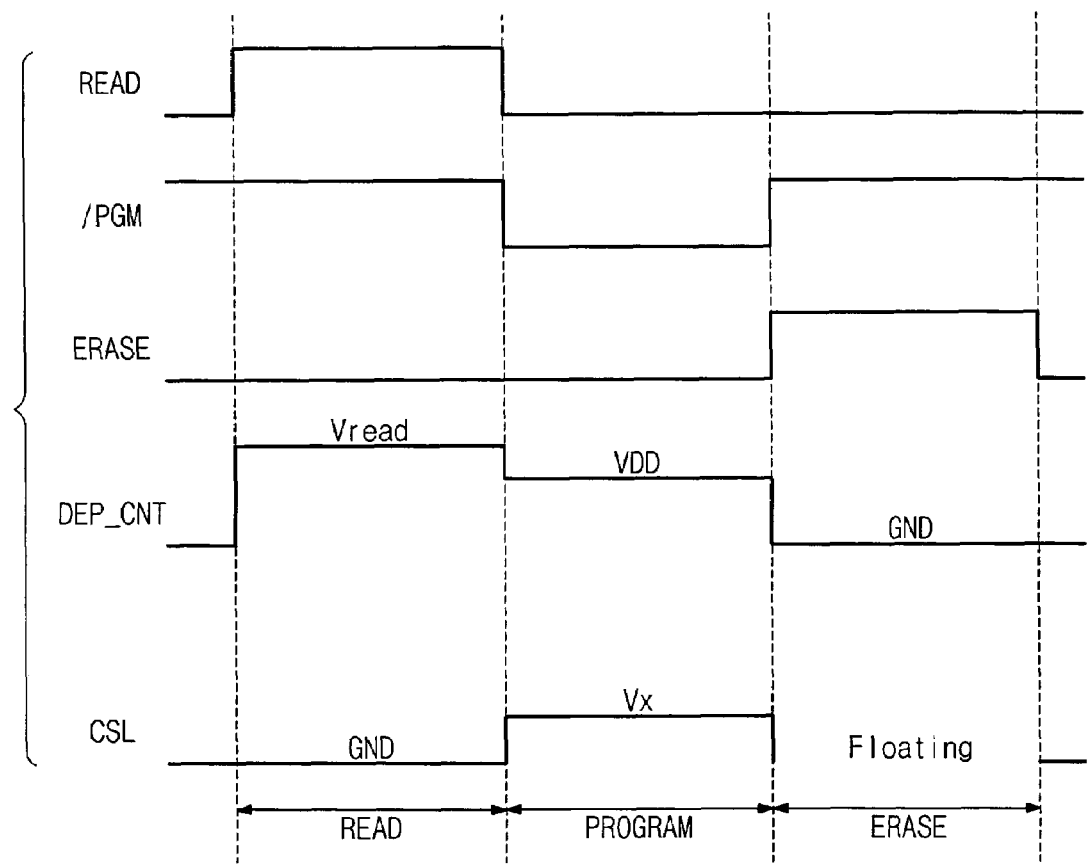
FIG. 5 is a timing diagram of signals for effectuating an operation of the non-volatile memory device shown in FIG. 3.

FIG. 5 is a timing diagram of signals for effectuating an operation of the non-volatile memory device shown in FIG. 3. In FIG. 5, the first control signal READ is a flag signal for a read operation; the second control signal /PGM is a flag signal for a program operation; and the third control signal ERASE is a flag signal for an erase operation. The control signals READ, /PGM, and ERASE are generated by control logic (not shown) provided to the non-volatile memory device according to an input command.

Hereinafter, an operation of the non-volatile memory device according to an embodiment of the present invention will be described.

When a read operation starts, the read voltage generating circuit 160 generates and provides a read voltage Vread to deselected word lines of a memory block. During a precharge interval, the read voltage generating circuit 160 is charged with a predetermined precharge voltage by page buffers PB0~PBn corresponding to bit lines BL0~BLn. During a develop interval, a sensing current is supplied from the page buffers PB0~PBn corresponding to bit lines BL0~BLn. During a sense interval, respective electric potentials of the bit lines BL0~BLn are sensed by corresponding page buffers. A current flowing through the common source line CSL during a series of intervals is discharged through the common source line driving circuit 140.

The discharge operation of the common source line driving circuit 140 is described in more detail below. During the read operation, as shown in FIG. 5, the first control signal READ is activate at a high level, whereas the second and third control signals /PGM and ERASE are inactivated at high and low levels, respectively. According to the non-activations of the second and third control signals /PGM and ERASE, both of the PMOS and NMOS transistors 207 and 208 of the control signal generator 144 in FIG. 4 are turned off. The PMOS transistor 201 of the driver 142 is turned off by the second control signal /PGM, and the NMOS transistor 206 thereof is turned off by the third control signal ERASE. As the first control signal READ is activated at a high level, the switch pump 209 transfers the read voltage Vread to the second node N2. That is, the fourth control signal DEP_CNT has the read voltage Vread during the read operation. The fourth control signal DEP_CNT having the read voltage Vread is applied to a gate of the depletion MOS transistor 203. At the same time, the NMOS transistor 202 of the driver 142 is turned on by the first control signal READ. During the read operation, as a read voltage Vread higher than the power supply voltage VDD is supplied to the gate of the depletion MOS transistor 203, the current driving performance of the depletion MOS transistor 203 is improved over that of the depletion MOS transistor 21 shown in FIG. 1. A current to be transferred to the common source line CSL during a develop interval of the read operation is easily discharged through the common source line driving circuit 140. As a result, the common source line CSL is maintained at the ground voltage, resulting in an improvement in a read characteristic.

During the program operation, as shown in FIG. 5, the second control signal /PGM is activated at a low level, whereas the first and third control signals READ and ERASE are inactivated at low levels, respectively. According to the non-activations of the second and third control signals READ and ERASE, both of the NMOS transistor 208 and the switch pump 209 of the control signal generator 144 are turned off. Also, the NMOS transistors 202 and 206 of the driver 142 are turned off by the first and third control signals READ and ERASE, respectively. As the second control signal /PGM is activated at a low level, the fourth control signal DEP_CNT has the power supply voltage VDD. The fourth control signal DEP_CNT having the power supply voltage VDD is applied to the depletion MOS transistor 203 of the driver 142. At the same time, the PMOS transistor 201 of the driver 142 is turned on by the second control signal /PGM. Consequently, the power supply voltage VDD is supplied to the gate of the depletion MOS transistor 203 during the program operation that results in the driving of the common source line CSL by a predetermined voltage Vx lower than the power supply voltage VDD, as shown in FIG. 5.

During an erase operation, as shown in FIG. 5, the third control signal ERASE is activated at a high level, whereas first and second control signals READ and /PGM are inactivated at low and high levels, respectively. According to the non-activations of the first and second control signals READ and /PGM, the PMOS transistor 207 and the switch pump 209 of the control signal generator 144 are turned off. The PMOS and NMOS transistors 201 and 202 are also turned off by the second and first control signals /PGM and READ, respectively. As the third control signal ERASE is activated at a high level, the fourth control signal DEP_CNT has the ground voltage. The fourth control signal DEP_CNT having the ground voltage is applied to the gate of the depletion MOS transistor 203. Simultaneously, the NMOS transistor 206 is turned on by the third control signal ERASE. During the erase operation, the ground voltage is supplied to the gate of the depletion MOS transistor 203, and the common source line CSL is floated.

Figure 6:
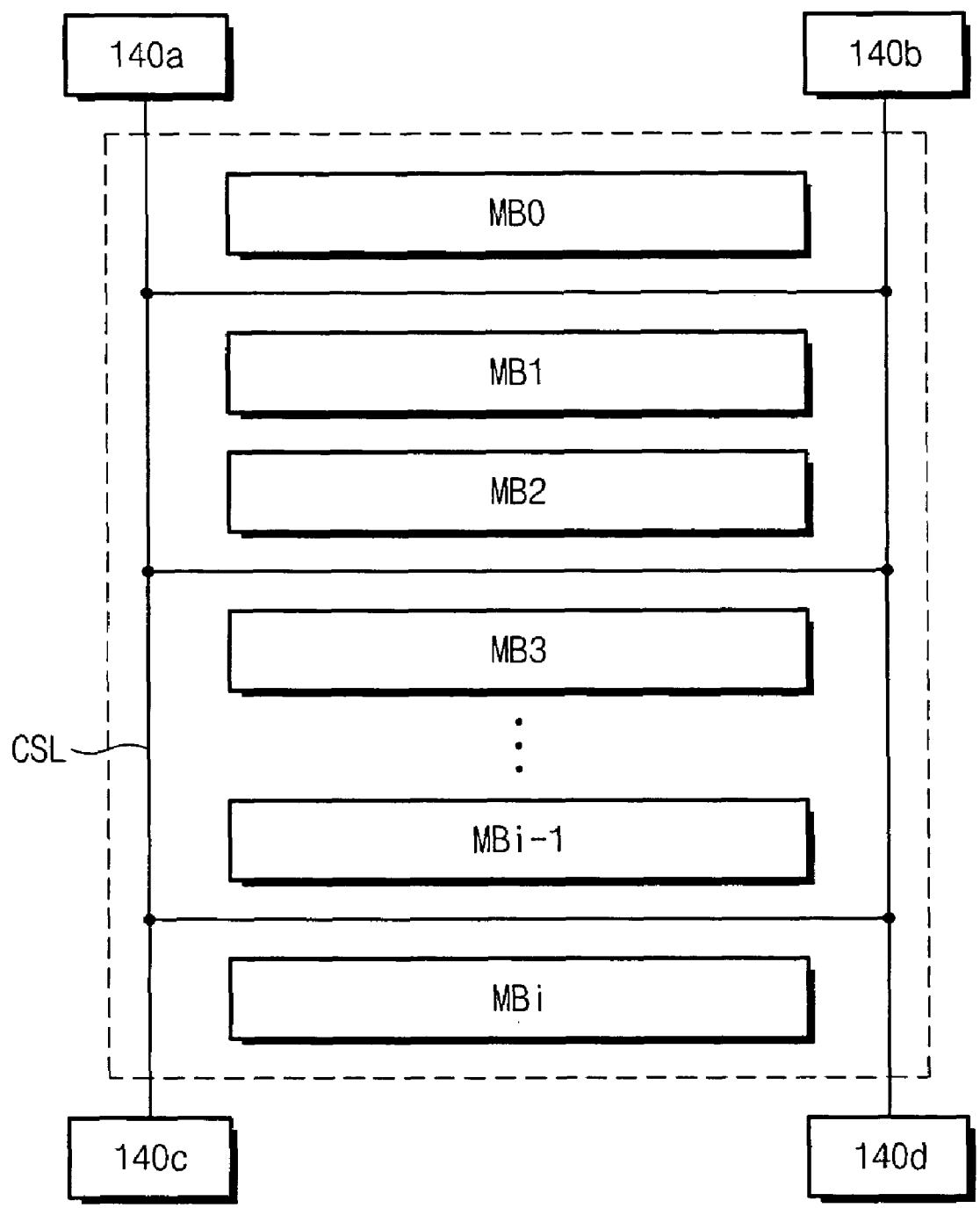
FIG. 6 is a block diagram schematically showing a non-volatile memory device according to another embodiment of the present invention.

Although only one common source line driving circuit 140 is arranged in FIG. 3, the non-volatile memory device according to the present invention can be provided with at least two common source line driving circuits 140. For example, as shown in FIG. 6, four common source line driving circuits 140a, 140b, 140c, and 140c can be provided for the non-volatile memory device according to the present invention. It will be apparent to those skilled in the art that more common source line driving circuits than four can be used in the present invention.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

As mentioned above, during a read operation, a common source line CSL is maintained at a ground voltage by applying a read voltage higher than a power supply voltage to a gate of a depletion MOS transistor connected to the common source line CSL, allowing a read characteristic to be improved.

What is claimed is:

1. A non-volatile memory device including memory blocks, each memory block having a plurality of word lines, the non-volatile memory device comprising:
    a common source line arranged to be shared by the memory blocks;
    a first transistor connected to the common source line;
    a second transistor for connecting the first transistor to a reference voltage during a read operation; and
    a control signal generator having an output control signal coupled to the gate of the first transistor and operative selectively to apply a high voltage higher than a power supply voltage to the gate of the first transistor during a read operation and to apply the power supply voltage to the gate during a program operation.

2. The non-volatile memory device as set forth in claim 1, wherein the high voltage is a read voltage that is supplied to deselected word lines of the memory block during the read operation.

3. The non-volatile memory device as set forth in claim 1, wherein the first transistor is a depletion MOS transistor, and the second transistor is an NMOS transistor.

4. The non-volatile memory device as set forth in claim 1, wherein the control signal generator is operative to apply to the gate of the first transistor a ground voltage as the reference voltage during an erase operation.

5. A non-volatile memory device, comprising:
    memory blocks;
    a common source line arranged to be shared by the memory blocks; and
    a common source line driving circuit for driving the common source line,
    wherein the common source line driving circuit includes:
    a control signal generator for generating a control signal having a voltage variable according to an operation mode;
    a depletion MOS transistor connected to the common source line and having a gate controlled by the control signal from the control signal generator; and
    an NMOS transistor for connecting the depletion MOS transistor to a reference voltage during the read operation,
    wherein the control signal applied to the gate of the depletion MOS transistor is charged with a voltage higher than a power supply voltage during a read operation.

6. The non-volatile memory device as set forth in claim 5, wherein the higher voltage is a read voltage that is supplied to deselected word lines of the memory block during the read operation.

7. The non-volatile memory device as set forth in claim 5, wherein each of the memory blocks includes NAND cell strings.

8. The non-volatile memory device as set forth in claim 5, wherein the control signal has a power supply voltage during a program operation, and has a ground voltage as the reference voltage during an erase operation.

9. A non-volatile memory device comprising memory blocks, a common source line arranged to be shared by the memory blocks, and a common source line driving circuit for driving the common source line,
   wherein the common source line driving circuit includes:
   a control signal generator for generating a control signal having a voltage changed according to an operation mode of the non-volatile memory device;
   a first transistor for connecting an internal node to a power supply voltage during a program operation;
   a second transistor for connecting the internal node to a ground voltage during a read operation;
   a first depletion MOS transistor connected between the internal node and the common source line and controlled by the control signal;
   a resistor having a first end connected the common source line;
   a second depletion MOS transistor having a drain connected to a second end of the resistor and a gate connected to the power supply voltage; and
   a third transistor for connecting a source of the second depletion MOS transistor to the ground voltage during an erase operation,
   wherein the control signal has a voltage higher than the power supply voltage during the read operation and has a ground voltage during the erase operation.

10. The non-volatile memory device as set forth in claim 9, wherein the first transistor is a PMOS transistor, whereas the second and third transistors are NMOS transistors.

11. The non-volatile memory device as set forth in claim 9, wherein the control signal generator includes:
    a PMOS transistor for providing the power supply voltage to a line of the control signal during the program operation;
    an NMOS transistor for connecting the control signal line to the ground voltage during the erase operation; and
    a switch pump for providing the higher voltage to the control signal line during the read operation.

12. The non-volatile memory device as set forth in claim 11, wherein the higher voltage is a read voltage that is supplied to deselected word lines of the memory block during the read operation.

13. The non-volatile memory device as set forth in claim 9, further comprising a third depletion MOS transistor between the first transistor and the internal node, and a gate of the third depletion MOS transistor is grounded.

14. A non-volatile memory device, comprising:
    memory blocks;
    a common source line arranged to be shared by the memory blocks;
    a read voltage generating circuit for generating a read voltage to be applied to the memory blocks during a read operation; and
    a common source line driving circuit for receiving the read voltage from the read voltage generating circuit and driving the common source line,
    wherein the common source line driving circuit includes:
    a control signal generator for generating a control signal having a voltage variable according an operation mode;
    a depletion MOS transistor connected to the common source line and having a gate controlled by the control signal from the control signal generator; and
    an NMOS transistor for connecting the depletion MOS transistor to a reference voltage during the read operation;
    the control signal applied to the gate of the depletion MOS transistor having the read voltage higher than a power supply voltage during the read operation.

15. The non-volatile memory device as set forth in claim 14, wherein each of the memory blocks includes NAND cell strings.

16. The non-volatile memory device as set forth in claim 14, wherein the control signal has a power supply voltage during a program operation and has a ground voltage during an erase operation as the reference voltage.

17. The non-volatile memory device as set forth in claim 14, wherein the control signal generator includes:
    a PMOS transistor for providing the power supply voltage to a line of the control signal during a program operation;
    an NMOS transistor for connecting the control signal line to the ground voltage during an erase operation; and
    a switch pump for providing the higher voltage to the control signal line during the read operation.

* * * * *